US009326397B2

(12) United States Patent
Yamazaki

(10) Patent No.: US 9,326,397 B2
(45) Date of Patent: Apr. 26, 2016

(54) ATTACHMENT DEVICE, ELECTRONIC APPARATUS, AND LOCKING MECHANISM

(71) Applicant: FUJITSU LIMITED, Kawasaki-shi, Kanagawa (JP)

(72) Inventor: Hiroto Yamazaki, Shinjuku (JP)

(73) Assignee: FUJITSU LIMITED, Kawasaki (JP)

( * ) Notice: Subject to any disclaimer, the term of this patent is extended or adjusted under 35 U.S.C. 154(b) by 166 days.

(21) Appl. No.: 14/272,707

(22) Filed: May 8, 2014

(65) Prior Publication Data

US 2014/0347815 A1  Nov. 27, 2014

(30) Foreign Application Priority Data

May 24, 2013 (JP) ................... 2013-110172

(51) Int. Cl.
*G06F 1/16* (2006.01)
*H05K 5/02* (2006.01)

(52) U.S. Cl.
CPC ............ *H05K 5/0208* (2013.01); *G06F 1/1632* (2013.01); *Y10T 70/554* (2015.04)

(58) Field of Classification Search
CPC ........... G06F 1/16; G06F 1/1632; H05K 5/02; H05K 5/0208; H05K 5/0221
USPC ................................ 361/679.57, 683, 679.43
See application file for complete search history.

(56) References Cited

U.S. PATENT DOCUMENTS

| 5,323,291 A * | 6/1994 | Boyle | G06F 1/1632 361/679.42 |
| 2003/0128506 A1* | 7/2003 | Won | G06F 1/1632 361/679.57 |
| 2006/0082965 A1 | 4/2006 | Walker et al. | |

FOREIGN PATENT DOCUMENTS

| JP | 10-171552 A | 6/1998 |
| JP | 2000-267762 A | 9/2000 |
| JP | 2006-120150 A | 5/2006 |

* cited by examiner

*Primary Examiner* — Dion R Ferguson
*Assistant Examiner* — Mandeep S Buttar
(74) *Attorney, Agent, or Firm* — Westerman, Hattari, Daniels & Adrian, LLP

(57) ABSTRACT

An attachment device includes a casing, a fastener member provided in the casing and movable between an attachable and detachable position where an electronic device is attachable to or detachable from the casing and a fastening position where the electronic device is fastened to the casing, a lock member provided in the casing and configured to restrain the fastener member from moving from the fastening position to the attachable and detachable position, and a stop member provided in the casing and configured to stop the lock member from restraining the movement of the fastener member, the stop member stopping the lock member until the fastener member fastens the electronic device to the casing.

12 Claims, 16 Drawing Sheets

ATTACHMENT DEVICE, ELECTRONIC APPARATUS, AND LOCKING MECHANISM

CROSS-REFERENCE TO RELATED APPLICATION

This application is based upon and claims the benefit of priority of the prior Japanese Patent Application No. 2013-110172, filed on May 24, 2013, the entire contents of which are incorporated herein by reference.

FIELD

The embodiment discussed herein is related to an attachment device, an electronic apparatus, and a locking mechanism.

BACKGROUND

There are some attachment devices to which electronic devices such as a notebook personal computer are attachable. Such an attachment device includes thereinside a circuit board and so forth to which peripheral devices such as a mouse are to be connected (see Japanese Laid-open Patent Publication No. 2006-120150, Japanese Laid-open Patent Publication No. 2000-267762, and Japanese Laid-open Patent Publication No. 10-171552, for example).

The attachment device includes, for example, a hook and an operation lever. The hook is movable between an attachable and detachable position where an electronic device is attachable to or detachable from the attachment device and an anchoring position where the hook anchors the electronic device. The operation lever is configured to move the hook from the anchoring position to the attachable and detachable position. To attach an electronic device to the attachment device, while the electronic device is pressed against the hook, the hook is temporarily moved to the attachable and detachable position. Subsequently, the hook is made to anchor the electronic device. Thus, the electronic device is fastened to the attachment device. To detach the electronic device from the attachment device, the hook is moved from the anchoring position to the attachable and detachable position by using the operation lever, whereby the electronic device that has been anchored by the hook is released. Thus, the electronic device is allowed to be detached from the attachment device.

In addition, there is an antitheft measure for the above attachment device in which a security lock connected to a desk or the like with wire is attached to the attachment device. In one of antitheft measures for the attachment device and the electronic device, the hook is disabled by using a security lock with the electronic device being attached to the attachment device. Such measures are disclosed by, for example, Japanese Laid-open Patent Publication No. 2006-120150, Japanese Laid-open Patent Publication No. 2000-267762, and Japanese Laid-open Patent Publication No. 10-171552.

SUMMARY

According to an aspect of the invention, an attachment device includes a casing, a fastener member provided in the casing and movable between an attachable and detachable position where an electronic device is attachable to or detachable from the casing and a fastening position where the electronic device is fastened to the casing, a lock member provided in the casing and configured to restrain the fastener member from moving from the fastening position to the attachable and detachable position, and a stop member provided in the casing and configured to stop the lock member from restraining the movement of the fastener member, the stop member stopping the lock member until the fastener member fastens the electronic device to the casing.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Figure 1:
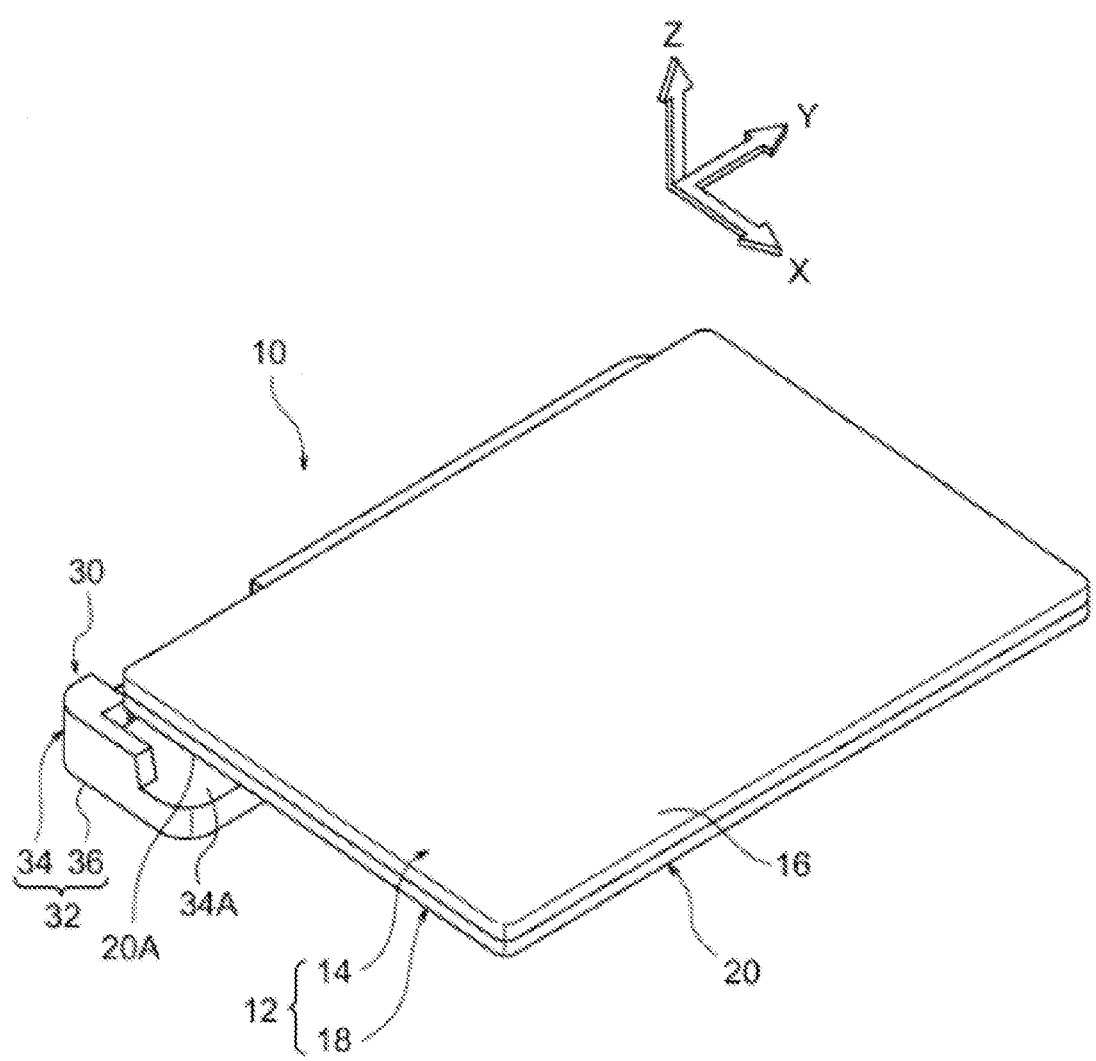
FIG. 1 is a perspective view of an electronic apparatus according to an embodiment.

In the related art, if the hook is disabled by the security lock before the electronic device is attached to the attachment device, the following problem may occur. Specifically, before the electronic device is attached to the attachment device, the hook has to be enabled by removing the security lock from the attachment device. This may increase the number of steps of attaching the electronic device to the attachment device.

An embodiment of the technology disclosed by the present application will now be described with reference to the accompanying drawings. In the drawings, arrow X is oriented toward the front side in the anteroposterior direction of an attachment device (the device anteroposterior direction), arrow Y is oriented toward a first side (the right side) in the width direction of the attachment device (the device width direction), and arrow Z is oriented toward the upper side in the vertical direction of the attachment device (the device vertical direction).

Electronic Apparatus

FIG. 1 illustrates an electronic apparatus 10 according to the present embodiment. The electronic apparatus 10 includes a notebook personal computer (hereinafter referred to as notebook PC) 12 as an exemplary electronic device, and an attachment device 30 to which the notebook PC 12 is attached.

Notebook PC

Figure 2:
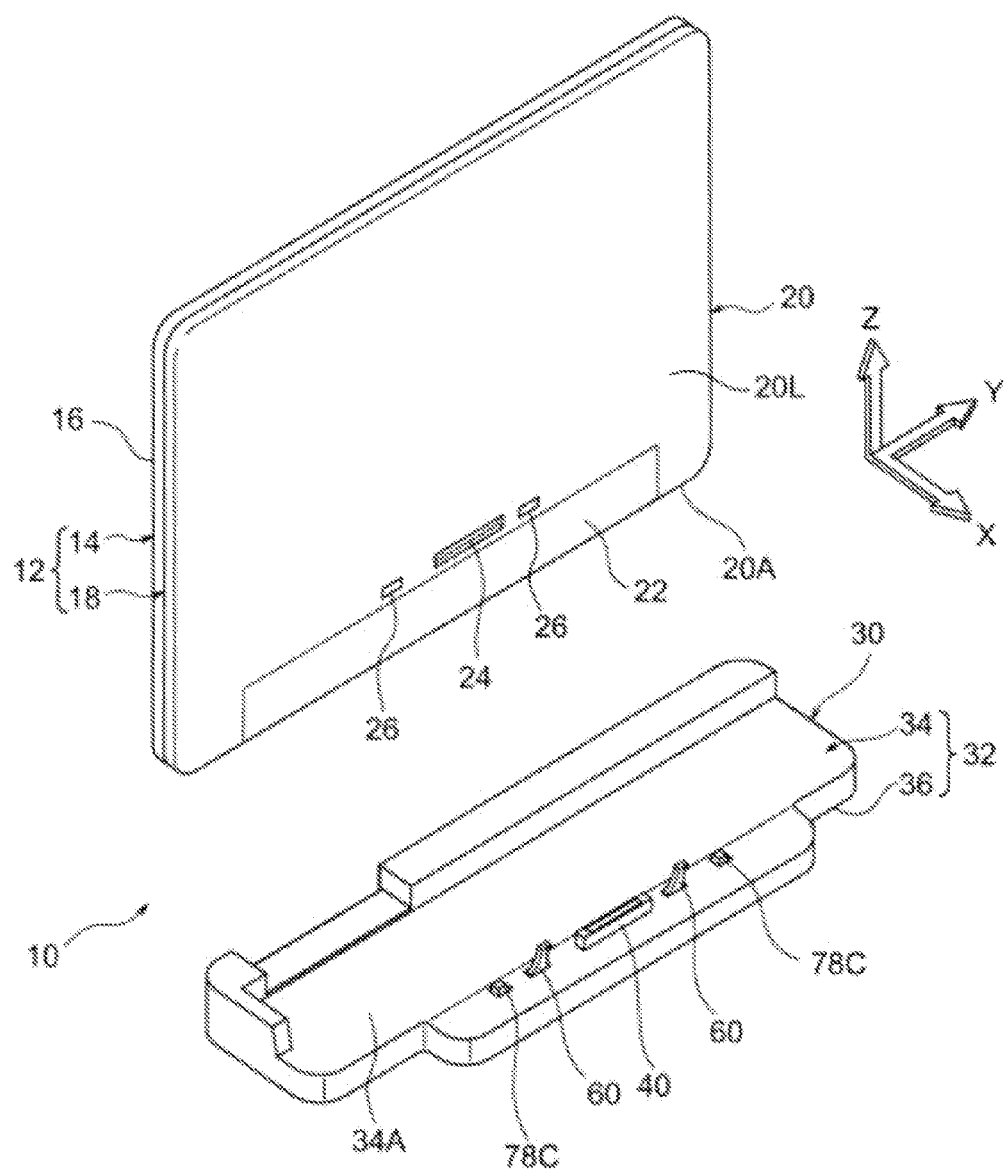
FIG. 2 is another perspective view of the electronic apparatus illustrated in FIG. 1 with a notebook personal computer detached from an attachment device.

The notebook PC 12 includes a display unit 14 and a body unit 18. The display unit 14 is openably and closably (rotatably) supported at the rear end of the body unit 18 with the aid of a hinge unit (not illustrated). The display unit 14 includes a display-side casing 16 having a flat box-like shape. The display-side casing 16 houses a display panel such as a liquid crystal panel. In FIGS. 1 and 2, the display unit 14 is in a closed state.

The body unit 18 includes a body-side casing 20 having a flat box-like shape. The body-side casing 20 houses the following: a circuit board (motherboard) on which a central processing unit (CPU) and so forth are mounted, a storage device such as a hard disk drive, a battery, and so forth. The body-side casing 20 is provided with input devices (not illustrated) such as a keyboard and a touch pad.

As illustrated in FIG. 2, a bottom wall 20L of the body-side casing 20 is provided at a rear end 20A thereof with a battery cover 22 for the replacement of the battery (not illustrated). The bottom wall 20L is also provided with a connector 24 near the rear end 20A. The connector 24 is an exemplary electronic-device-side connecting portion. A connector 40 of the attachment device 30 to be described below is connected to the connector 24. The bottom wall 20L has a pair of hook insertion holes 26 on two respective sides of the connector 24 in the device width direction. A pair of hook portions 60 of the attachment device 30 to be described below are to be inserted into the respective hook insertion holes 26.

Attachment Device

The attachment device 30 is a port replicator that extends the function of the notebook PC 12. The attachment device 30 is to be attached to the rear end of the notebook PC 12. The attachment device 30 includes a casing 32 that supports the rear end 20A of the body-side casing 20 from the lower side. The casing 32 generally has a flat box-like shape and has a larger length in the device width direction.

Figure 3:
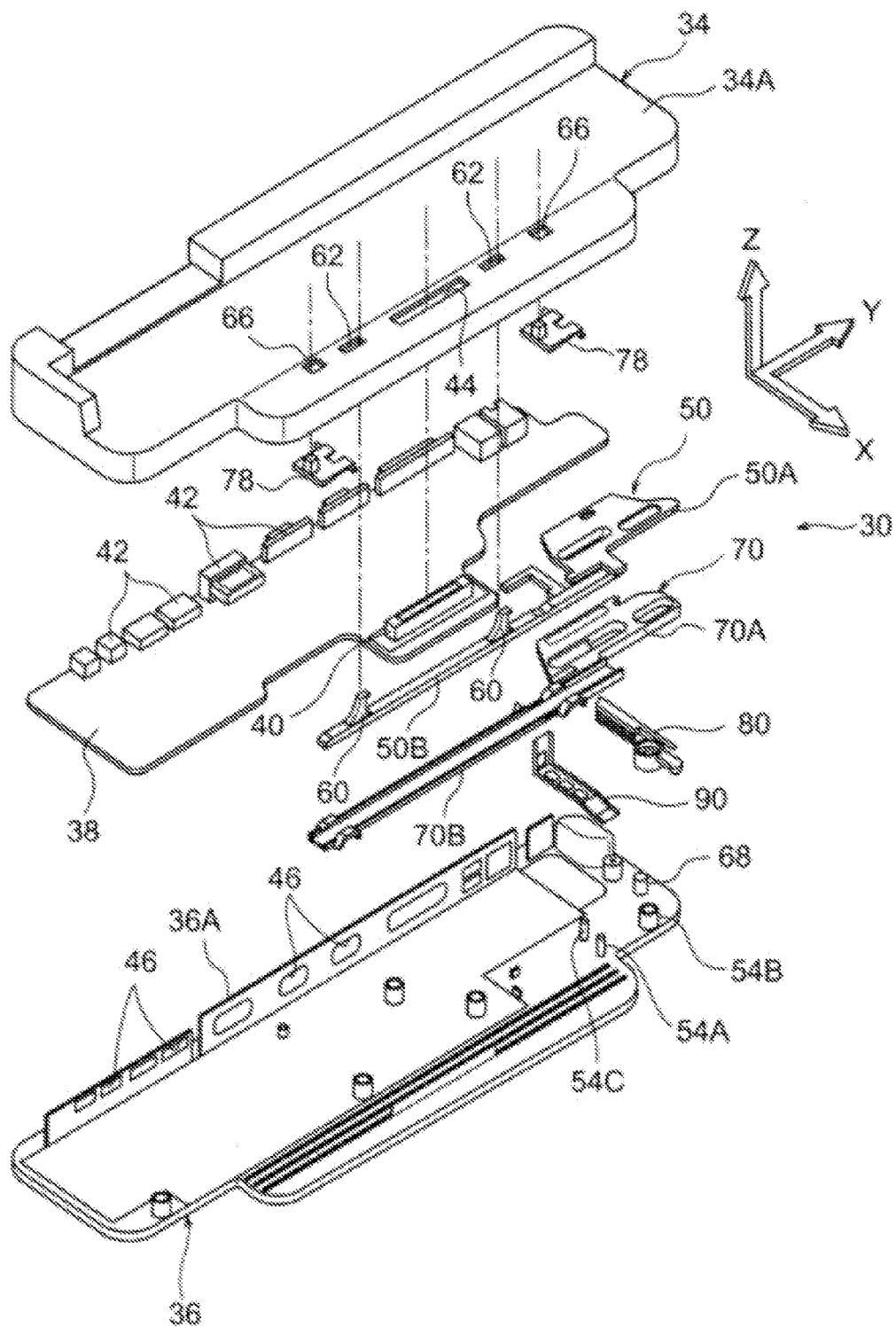
FIG. 3 is an exploded perspective view of the attachment device illustrated in FIG. 1.

As illustrated in FIG. 3, the casing 32 is divided in the device vertical direction into an upper case 34 and a lower case 36. The upper wall of the upper case 34 serves as a mounting portion 34A on which the rear end 20A of the body-side casing 20 is to be mounted. The casing 32 houses a circuit board 38, a fastening slider 50, a detaching slider 70, a pair of pushing members 78, an operation lever 80, and a restraining member 90.

The circuit board 38 includes the connector 40 to which the connector 24 (see FIG. 2) of the notebook PC 12 is to be connected, and a plurality of extension connectors 42 to which peripheral devices intended for the notebook PC 12 are to be connected. The connector 40, which is an exemplary attachment-device-side connecting portion, is provided at the front end of the circuit board 38 and is fitted in a connector-receiving opening 44 provided in the mounting portion 34A of the upper case 34.

The plurality of extension connectors 42 are arranged along the rear end of the circuit board 38 and are exposed to the outside through a plurality of connection holes 46 provided in a rear wall 36A of the lower case 36. The peripheral devices are to be connected to the plurality of extension connectors 42 through the connection holes 46.

Fastening Slider and Detaching Slider

The fastening slider 50 and the detaching slider 70, which are made of resin, are housed in the casing 32 and are positioned near the front end of the casing 32 in such a manner as to be slidable (movable) in the device width direction. When the fastening slider 50 is slid in the device width direction, the notebook PC 12 is fastened to the casing 32 of the attachment device 30. When the detaching slider 70 is slid in the device width direction, the body-side casing 20 of the notebook PC 12 is pushed upward by the pair of pushing members 78, whereby the notebook PC 12 is detached from the casing 32 of the attachment device 30. The fastening slider 50 and the detaching slider 70 are made to slide by the operation lever 80 that is housed in the casing 32 and is positioned near an end of the casing 32 that is on the first side in the device width direction.

Specifically, the fastening slider 50, as an exemplary fastener member, has a larger length in the device width direction and is urged toward the first side (in the direction of arrow Y) in the device width direction by an elastic member (not illustrated) such as a spring. The fastening slider 50 includes a slider attaching portion 50A positioned at an end of the casing 32 that is on the first side in the device width direction, and an extended portion 50B extending from the slider attaching portion 50A toward a second side in the device width direction (the side opposite the first side toward which arrow Y is oriented).

Figure 4:
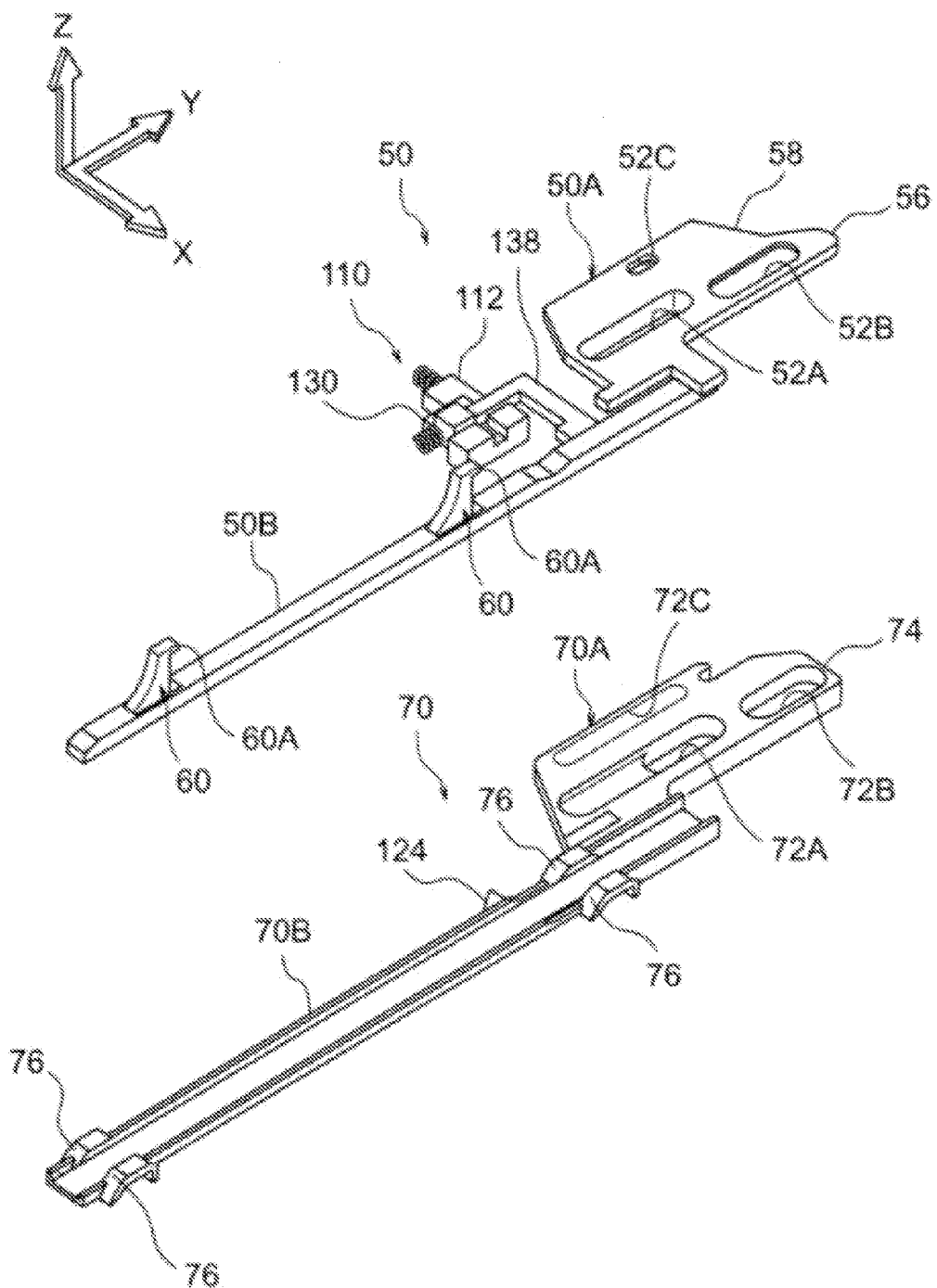
FIG. 4 is an enlarged perspective view of a fastening slider and a detaching slider illustrated in FIG. 3.

As illustrated in FIG. 4, the slider attaching portion 50A has three oblong holes 52A, 52B, and 52C each extending in the device width direction. Three bosses 54A, 54B, and 54C (see FIG. 3) projecting from the bottom wall of the lower case 36 are slidably fitted in the three oblong holes 52A, 52B, and 52C, respectively. The upper case 34 is secured to the bosses 54A, 54B, and 54C with screws or the like, whereby the fastening slider 50 is secured to the casing 32. The slider attaching portion 50A also includes, at an end thereof on the first side in the device width direction, a pushed part 56 that is to be pushed by a rotating arm portion 80B (see FIG. 8A) of the operation lever 80 to be described below, and a curved recess 58 that is not to be pushed by the rotating arm portion 80B.

As illustrated in FIG. 3, the extended portion 50B has the pair of hook portions 60 that fasten the notebook PC 12 to the casing 32. The pair of hook portions 60 are positioned on two respective sides of the connector 40 in the device width direction and are to be inserted into a pair of hook-receiving openings 62, respectively, provided in the upper case 34. As illustrated in FIG. 4, the hook portions 60 have respective catches 60A projecting from the tips thereof toward the first side in the device width direction. The catches 60A are to be inserted into the respective hook insertion holes 26 (see FIG. 2) provided in the body-side casing 20 of the notebook PC 12.

Figure 5A:
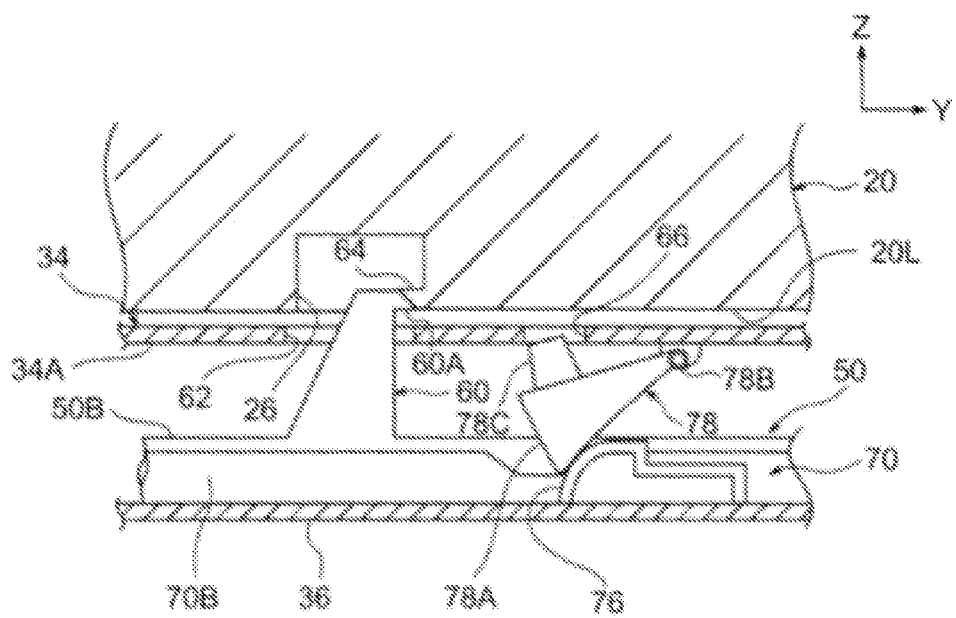
FIG. 5A is a vertical sectional view of the attachment device and illustrates the fastening slider, the detaching slider, and a pushing member illustrated in FIG. 3.
Figure 5B:
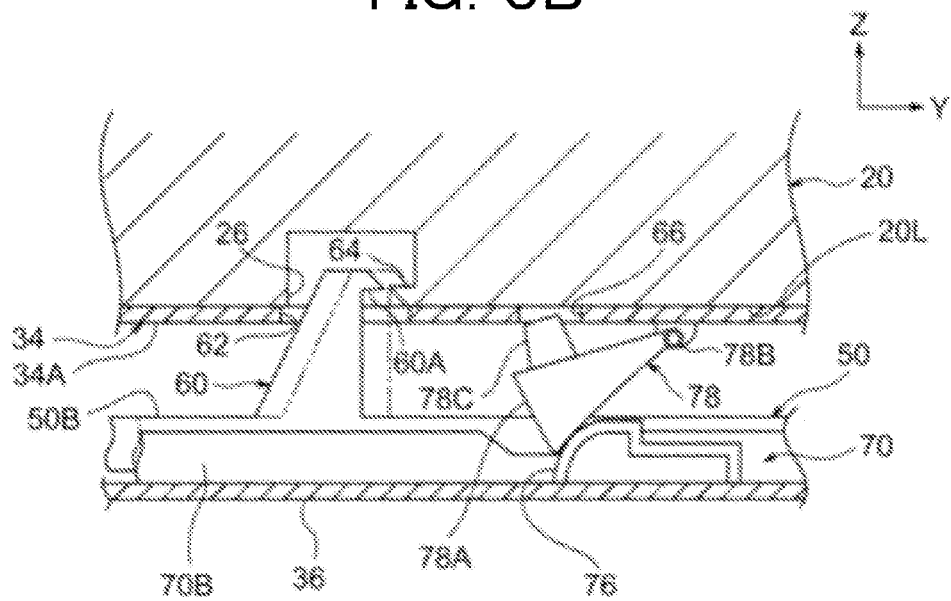
FIG. 5B is another vertical sectional view of the attachment device and illustrates the fastening slider, the detaching slider, and the pushing member illustrated in FIG. 3.

As illustrated in FIG. 5A, the edge of each of the hook insertion holes 26 forms a hook anchoring portion 64 as an exemplary fastened portion. A corresponding one of the catches 60A is to be anchored to the hook anchoring portion 64. To attach the notebook PC 12 to the attachment device 30, the fastening slider 50 is slid toward the second side in the device width direction while the hook anchoring portions 64 are pressed against the respective catches 60A, and the connector 24 (see FIG. 2) of the notebook PC 12 is then connected to the connector 40 of the attachment device 30. In this step, as illustrated in FIG. 5B, the hook portions 60 are moved from respective fastening positions illustrated by the dash-dot-dot line to respective attachable and detachable positions illustrated by the solid line, and the catches 60A of the hook portions 60 are inserted into the respective hook insertion holes 26. Subsequently, the hook portions 60 are moved from the respective attachable and detachable positions to the respective fastening positions with an urging force exerted by the elastic member (not illustrated), and the catches 60A of the hook portions 60 are anchored to the respective hook anchoring portions 64. Thus, the body-side casing 20 of the notebook PC 12 is fastened to the mounting portion 34A of the upper case 34.

As illustrated in FIG. 3, the detaching slider 70 as an exemplary unlock member is provided below the fastening slider 50. The detaching slider 70 has a larger length in the device width direction and is urged toward the first side in the device width direction by an elastic member (not illustrated) such as a spring. The detaching slider 70 includes a slider attaching portion 70A positioned at an end of the casing 32 that is on the first side in the device width direction, and a guide rail portion 70B extending from the slider attaching portion 70A toward the second side in the device width direction.

As illustrated in FIG. 4, the slider attaching portion 70A has three oblong holes 72A, 72B, and 72C each extending in the device width direction. The above-mentioned three bosses 54A, 54B, and 54C (see FIG. 3) are slidably fitted in the three oblong holes 72A, 72B, and 72C, respectively. The upper case 34 is secured to the bosses 54A, 54B, and 54C with screws or the like, whereby the detaching slider 70 is secured to the casing 32. The slider attaching portion 70A also includes, at an end thereof on the first side in the device width direction, a pushed part 74 that is to be pushed by a stepped part 80C (see FIG. 8A) of the operation lever 80 to be described below.

The guide rail portion 70B has a U-shaped cross section with the upper side thereof being open. The extended portion 50B of the fastening slider 50 is slidably fitted in the guide rail portion 70B. The guide rail portion 70B has two pairs of sloping parts 76 near two respective ends thereof on the first side and on the second side in the device width direction. Each pair of sloping parts 76 are provided on two respective sides of the guide rail portion 70B in the device anteroposterior direction. When the detaching slider 70 is slid, the sloping parts 76 push up the pushing members 78 (see FIG. 3).

Pushing Members

Figure 6A:
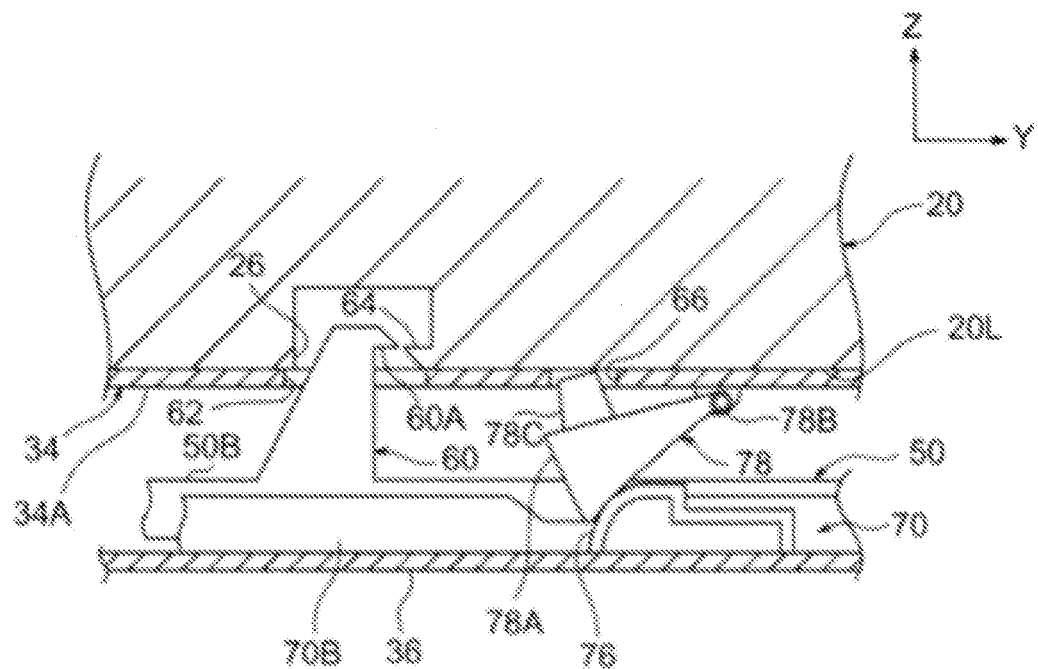
FIG. 6A is yet another vertical sectional view of the attachment device and illustrates the fastening slider, the detaching slider, and the pushing member illustrated in FIG. 3.

As illustrated in FIG. 3, the pair of pushing members 78 are positioned on two respective sides of the pair of hook portions 60 in the device width direction. As illustrated in FIG. 6A, the pushing members 78 each include a movable portion 78A, a shaft portion 78B provided at one end of the movable portion 78A, and a pushing projection 78C provided at the other end of the movable portion 78A.

Figure 6B:
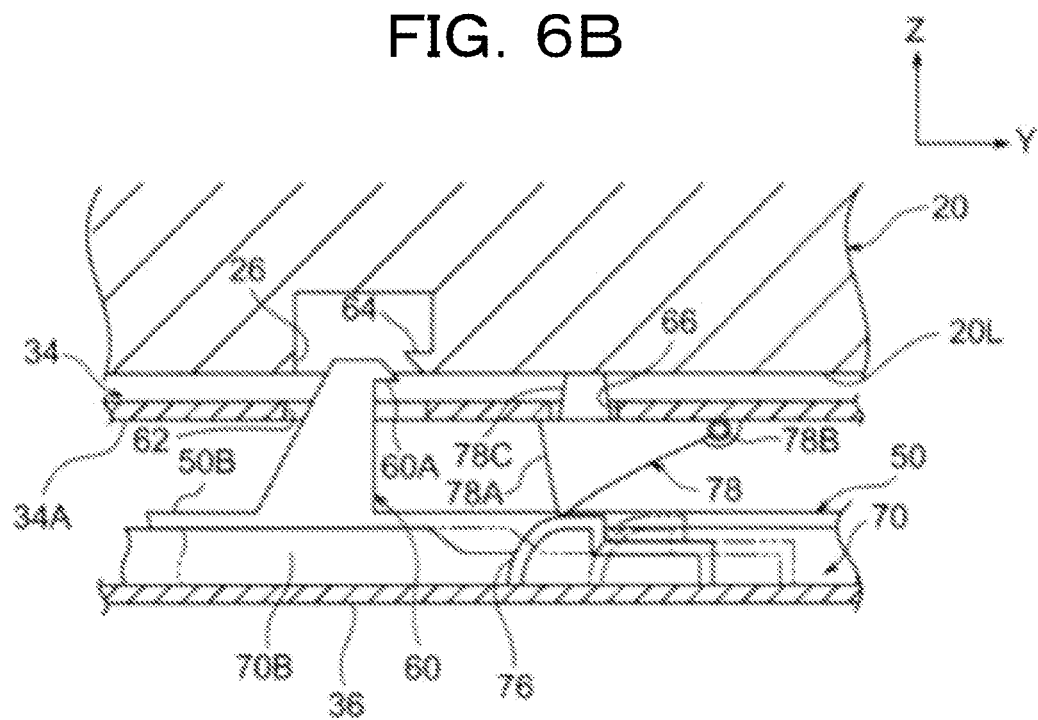
FIG. 6B is yet another vertical sectional view of the attachment device and illustrates the fastening slider, the detaching slider, and the pushing member illustrated in FIG. 3.

The lower surface of the movable portion 78A forms a sloping surface that is to be pushed upward by a corresponding one of the pairs of sloping parts 76 when the detaching slider 70 is slid toward the second side in the device width direction. The shaft portion 78B has an axis extending in the device anteroposterior direction and is rotatably supported by the upper case 34. Hence, when the movable portion 78A is pushed upward by the pair of sloping parts 76 from the lower side as illustrated in FIG. 6B, the movable portion 78A rotates about the shaft portion 78B. With the rotation of the movable portion 78A, the pushing projection 78C pushes the bottom wall 20L of the body-side casing 20 through a corresponding one of projection-receiving openings 66 provided in the mounting portion 34A of the upper case 34.

Operation Lever

Figure 7:
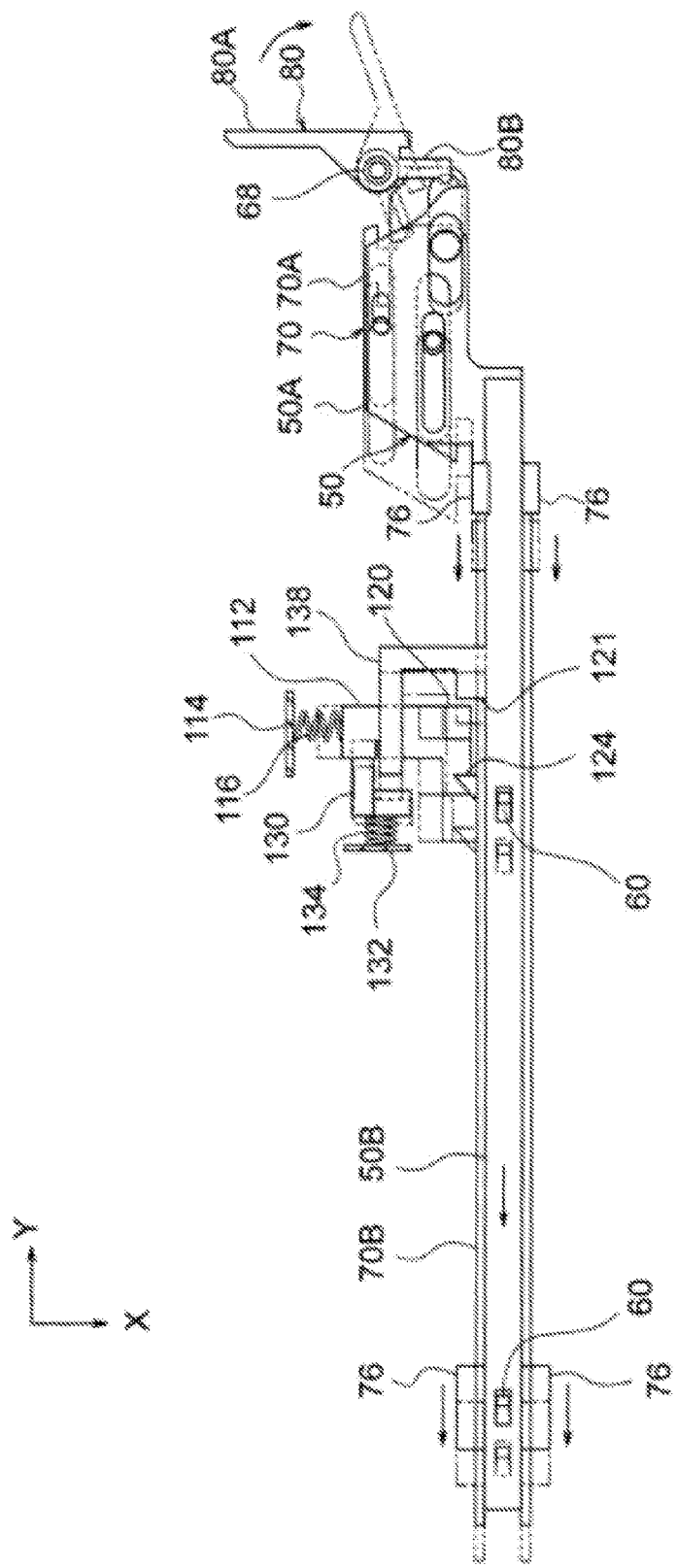
FIG. 7 is a plan view of the fastening slider, the detaching slider, and an operation lever illustrated in FIG. 3.

As illustrated in FIG. 7, the operation lever 80 as an exemplary operation member is rotatably supported by a boss 68 provided on the lower case 36 (see FIG. 3). When the user rotates the operation lever 80, the fastening slider 50 and the detaching slider 70 slide toward the second side in the device width direction at respective predetermined timings, which will be described separately below. Thus, the hook portions 60 of the fastening slider 50 and the sloping parts 76 of the detaching slider 70 behave as described above, and the notebook PC 12 is detached from the attachment device 30. Furthermore, when the operation lever 80 is rotated, an unlocking projection 124 to be described below operates and moves a lock member 112 from a locking position to an unlocking position.

Figure 8A:
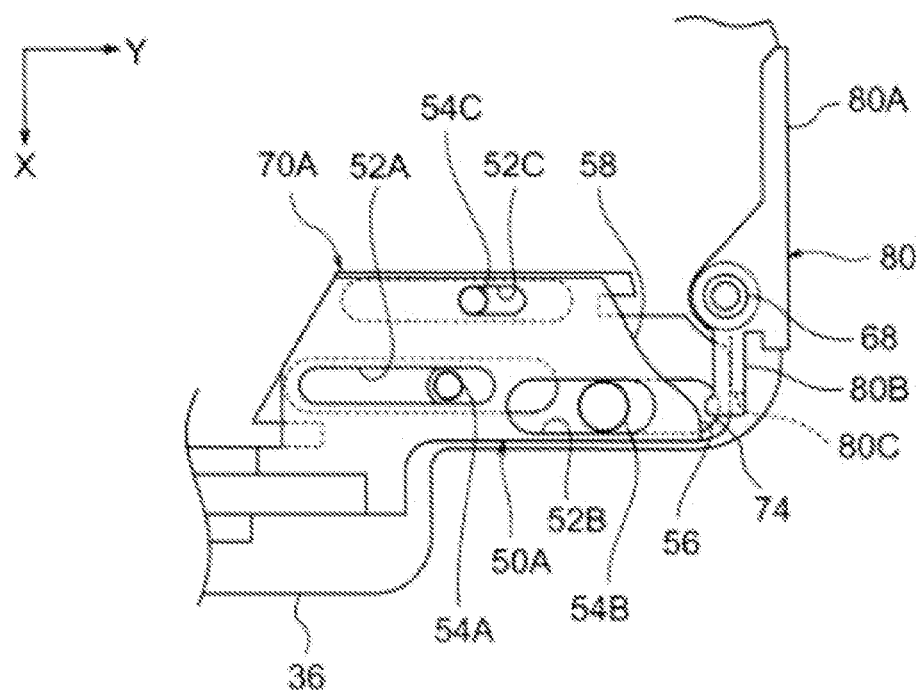
FIG. 8A is an enlarged plan view of the operation lever illustrated in FIG. 3.

Specifically, as illustrated in FIG. 8A, the operation lever 80 includes an operated portion 80A to be operated by the user, and the rotating arm portion 80B configured to push the pushed part 56 of the fastening slider 50. The rotating arm portion 80B includes the stepped part 80C provided in the lower surface thereof and configured to push the pushed part 74 of the detaching slider 70.

Now, behaviors (the timings of sliding) of the fastening slider 50 and the detaching slider 70 will be described.

Figure 8B:
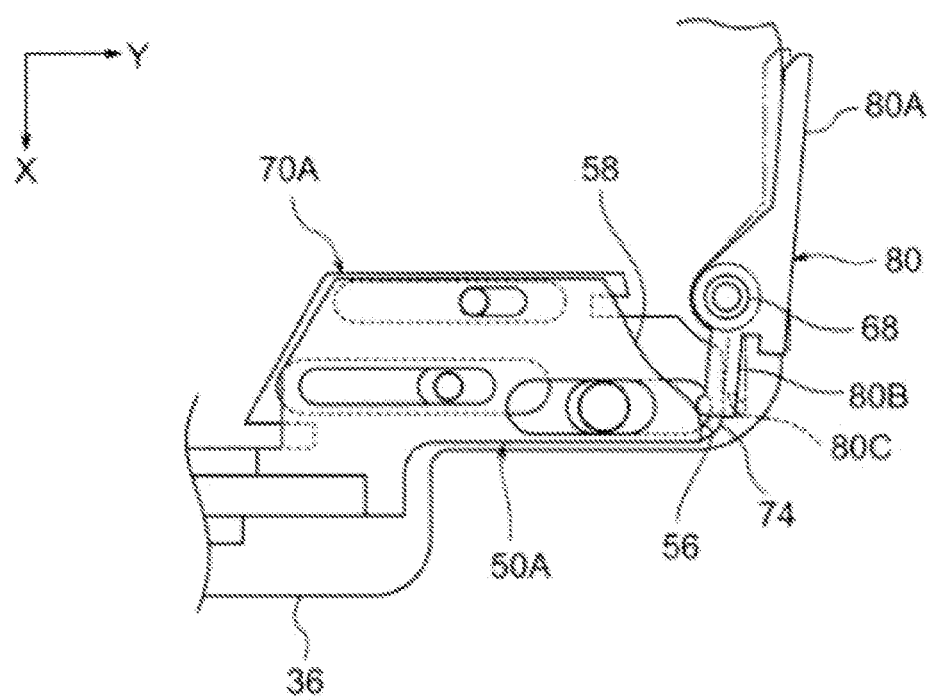
FIG. 8B is another enlarged plan view of the operation lever illustrated in FIG. 3.

As illustrated in FIGS. 8A and 8B, when the operation lever 80 is rotated, the stepped part 80C of the rotating arm portion 80B first pushes the pushed part 74 of the detaching slider 70, whereby the unlocking projection 124 (see FIG. 10) of the detaching slider 70 to be described below moves toward the second side in the device width direction.

Figure 8C:
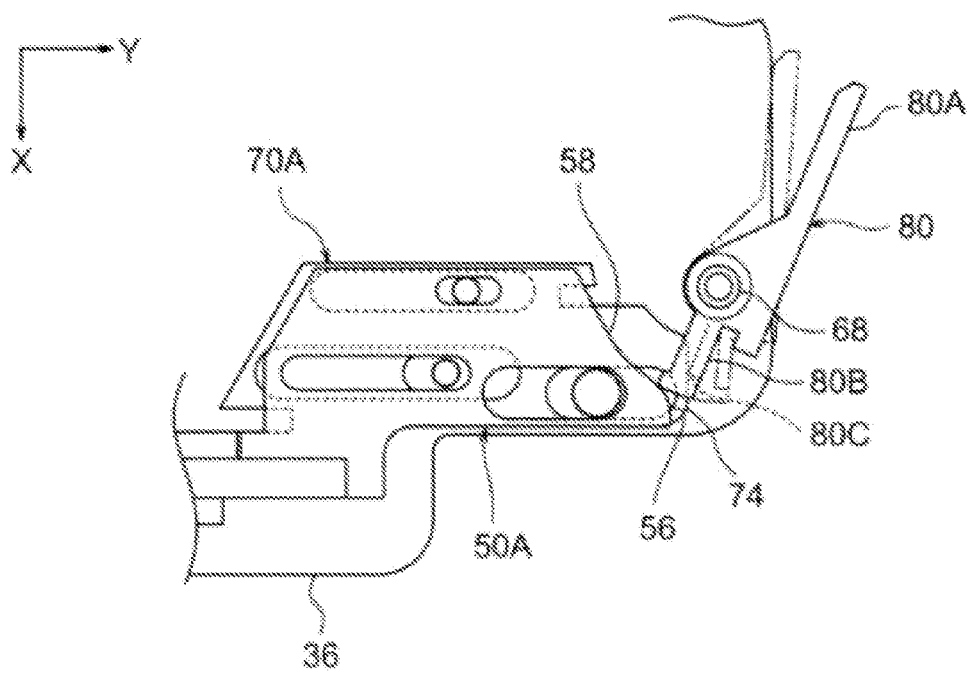
FIG. 8C is yet another enlarged plan view of the operation lever illustrated in FIG. 3.

Subsequently, when the operation lever 80 is further rotated as illustrated in FIG. 8C, the rotating arm portion 80B pushes the pushed part 56 of the fastening slider 50, whereby the fastening slider 50 slides toward the second side in the device width direction. Thus, as illustrated in FIG. 5B, the catches 60A of the hook portions 60 move from the respective fastening positions illustrated by the dash-dot-dot line to the respective attachable and detachable positions illustrated by the solid line, whereby the hook anchoring portions 64 that have been anchored by the catches 60A are released.

Figure 8D:
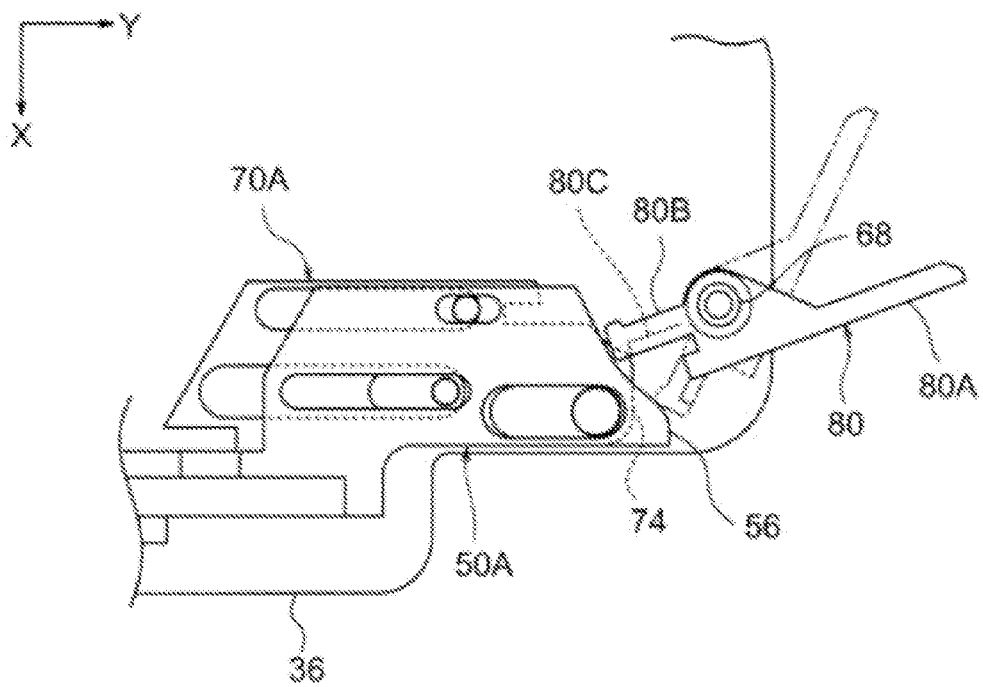
FIG. 8D is yet another enlarged plan view of the operation lever illustrated in FIG. 3.

Subsequently, when the operation lever 80 is further rotated as illustrated in FIG. 8D, the rotating arm portion 80B moves to the curved recess 58 of the fastening slider 50, whereby the fastening slider 50 stops sliding. Meanwhile, the stepped part 80C of the rotating arm portion 80B pushes the pushed part 74 of the detaching slider 70, whereby the detaching slider 70 slides toward the second side in the device width direction. Consequently, as illustrated in FIG. 6B, the sloping parts 76 of the detaching slider 70 push up the movable portions 78A of the pushing members 78, and the pushing projections 78C push the bottom wall 20L of the body-side casing 20 through the projection-receiving openings 66. Thus, the bottom wall 20L of the body-side casing 20 is lifted from the mounting portion 34A of the casing 32. Consequently, the connector 24 of the notebook PC 12 is disconnected from the connector 40 (see FIG. 2) of the attachment device 30, whereby the notebook PC 12 is detached from the attachment device 30.

Security Lock and Restraining Member

Figure 9:
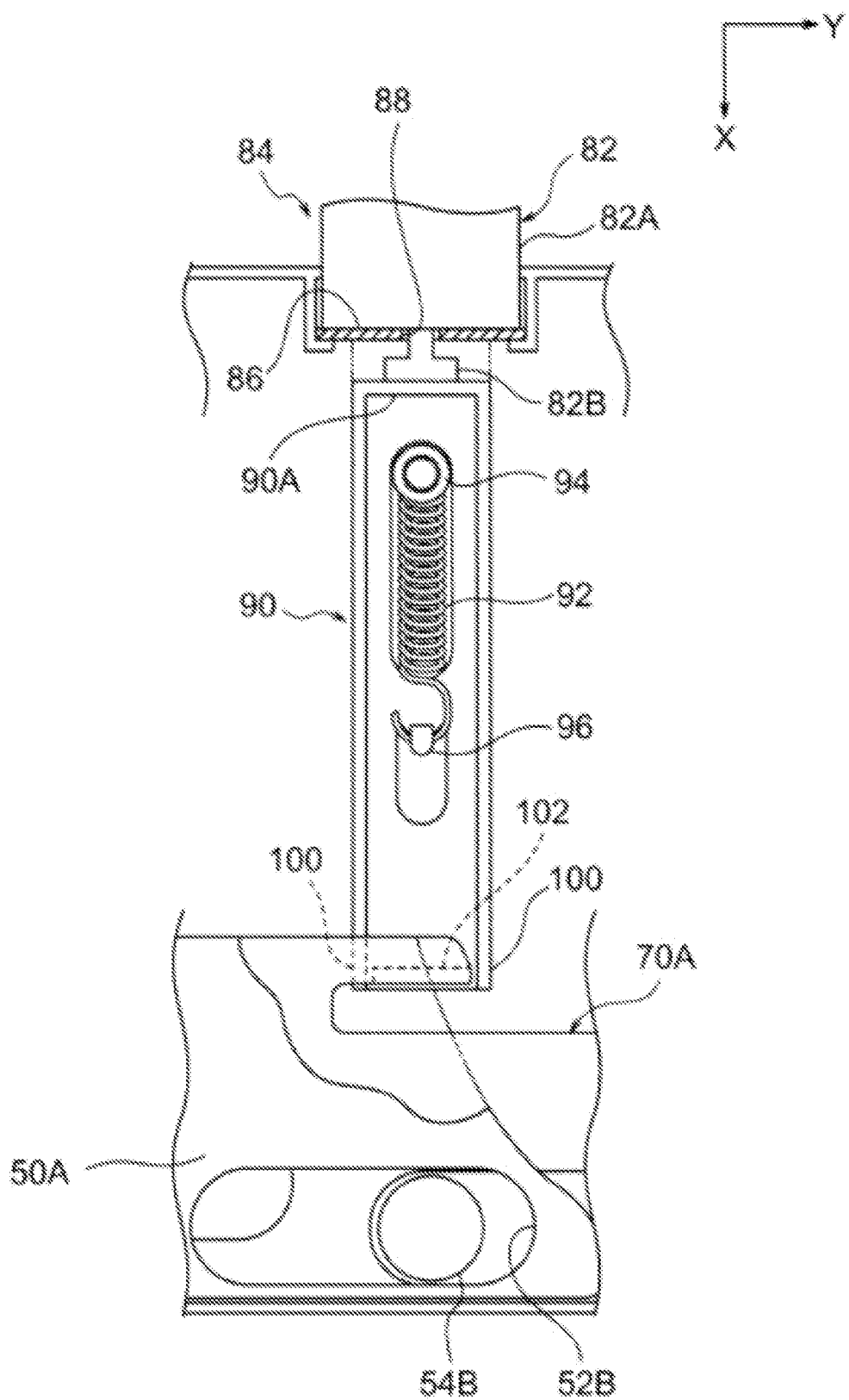
FIG. 9 is an enlarged plan view of a restraining member illustrated in FIG. 3.

As illustrated in FIG. 9, the rear wall 36A of the lower case 36 includes a lock attaching portion 84 to which a security lock 82 is to be attached. The security lock 82 includes a cylinder portion 82A into which a key (not illustrated) is to be inserted, and a T-shaped trap portion 82B rotatably supported by the cylinder portion 82A.

The lock attaching portion 84 includes an attaching plate 86. The attaching plate 86 has an oblong hole 88 extending in the device vertical direction. When the trap portion 82B of the security lock 82 is fitted into the oblong hole 88 and is rotated, the security lock 82 is attached to the attaching plate 86.

The restraining member 90 that restrains the detaching slider 70 from sliding is provided between the lock attaching portion 84 and the slider attaching portion 70A of the detaching slider 70. The restraining member 90 has a U-shaped cross section with the upper side thereof being open and has a larger length in the device anteroposterior direction. The restraining member 90 is slidable in the device anteroposterior direction and is urged toward the lock attaching portion 84 by a spring 92. One end of the spring 92 is attached to a boss 94 provided on the lower case 36. The other end of the spring 92 is attached to a spring attaching portion 96 provided on the restraining member 90.

The restraining member 90 includes a wall 90A provided at one end thereof and configured to be pushed by the security lock 82. In a state where the security lock 82 is yet to be attached to the attaching plate 86 of the lock attaching portion 84, the wall 90A is in contact with the attaching plate 86, as illustrated by the dash-dot-dot line, with the urging force exerted by the spring 92. The restraining member 90 also includes a pair of engagement ribs 100 provided on the other end thereof and configured to engage with an engagement receiving part 102 included in the slider attaching portion 70A. The engagement ribs 100 engage with the engagement receiving part 102 when the security lock 82 is attached to the attaching plate 86 of the lock attaching portion 84.

Specifically, when the security lock 82 is attached to the attaching plate 86 of the lock attaching portion 84, the trap portion 82B pushes the wall 90A of the restraining member 90 toward the slider attaching portion 50A. Thus, the pair of engagement ribs 100 of the restraining member 90 are positioned on two respective sides, in the device width direction, of the engagement receiving part 102 of the slider attaching portion 70A, whereby the detaching slider 70 is restrained from sliding in the device width direction. Consequently, the detaching slider 70 becomes inoperable with the operation lever 80.

Locking Mechanism

Figure 10:
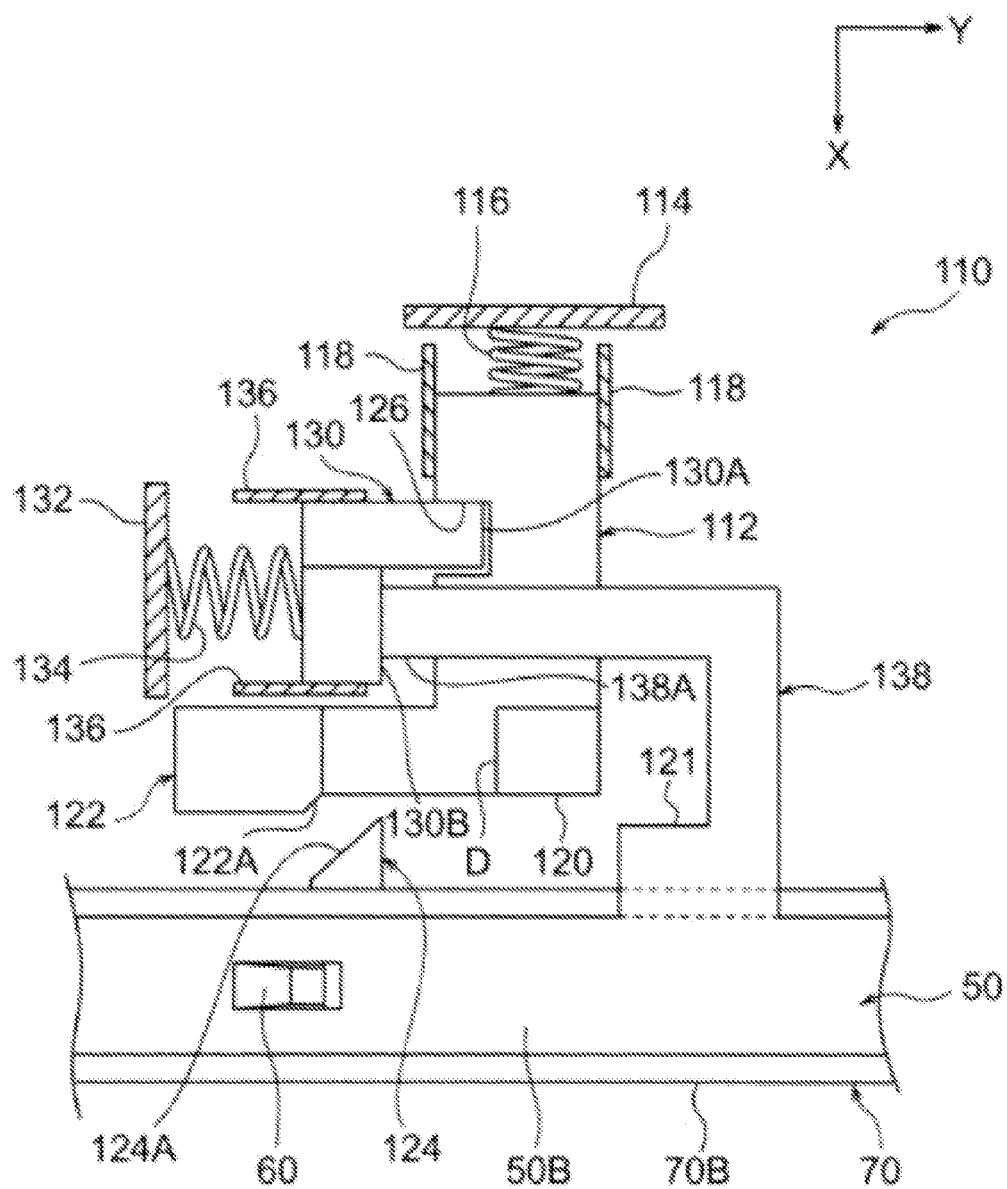
FIG. 10 is an enlarged plan view of a lock member and a stop member illustrated in FIG. 4.

As illustrated in FIG. 10, a locking mechanism 110 includes the lock member 112 and a stop member 130. The lock member 112 restrains the sliding of the fastening slider 50 from the fastening position to the attachable and detachable position and is provided on a side of the fastening slider 50. The lock member 112 is movable in a direction intersecting the direction of sliding of the fastening slider 50 and between a locking position that is nearer to the fastening slider 50 and an unlocking position that is farther from the fastening slider 50. The locking position and the unlocking position will be described separately below, together with the behavior of the lock member 112. In the present embodiment, the lock member 112 is movable in a direction (the device anteroposterior direction) orthogonal to the direction of sliding of the fastening slider 50.

The lock member 112 is provided between a supporting wall 114 included in the lower case 36 and the extended portion 50B of the fastening slider 50. A locking spring 116 as an exemplary lock elastic member is provided between one end of the lock member 112 and the supporting wall 114. The locking spring 116 urges the lock member 112 toward the fastening slider 50. In addition, a pair of guide walls 118 that guide the movement of the lock member 112 are provided on two respective sides of the lock member 112.

The lock member 112 includes a stopper part 120 provided at the other end thereof. When the lock member 112 is at the locking position, the stopper part 120 stops the sliding of the fastening slider 50 from the fastening position to the attachable and detachable position. Specifically, the extended portion 50B of the fastening slider 50 includes an engaging part 121 projecting toward the lock member 112. The engaging part 121 is positioned on the upstream side with respect to the lock member 112 in the direction of sliding of the fastening slider 50. When the lock member 112 is at the locking position and the fastening slider 50 is moved from the fastening position to the attachable and detachable position, the engaging part 121 engages with the stopper part 120. In contrast, when the lock member 112 is at the unlocking position, the engaging part 121 does not engage with the stopper part 120, allowing the fastening slider 50 to slide from the fastening position to the attachable and detachable position.

The lock member 112 further includes an arm portion 112A (see FIG. 11) provided at the other end thereof and extending from the stopper part 120 toward the second side in the device width direction. The arm portion 112A includes a pushed part 122 to be pushed by the detaching slider 70 such that the lock member 112 is moved from the locking position toward the unlocking position. Specifically, the guide rail portion 70B of the detaching slider 70 includes the unlocking projection 124 projecting toward the lock member 112. The unlocking projection 124 is an exemplary pushing portion included in the unlock member.

The unlocking projection 124 is positioned in a gap D defined between the pushed part 122 and the stopper part 120 of the lock member 112. The unlocking projection 124 has a sloping surface 124A sloping with respect to the direction of movement of the lock member 112. When the lock member 112 is at the locking position and the detaching slider 70 is slid toward the second side in the device width direction, the sloping surface 124A pushes the pushed part 122.

Figure 11:
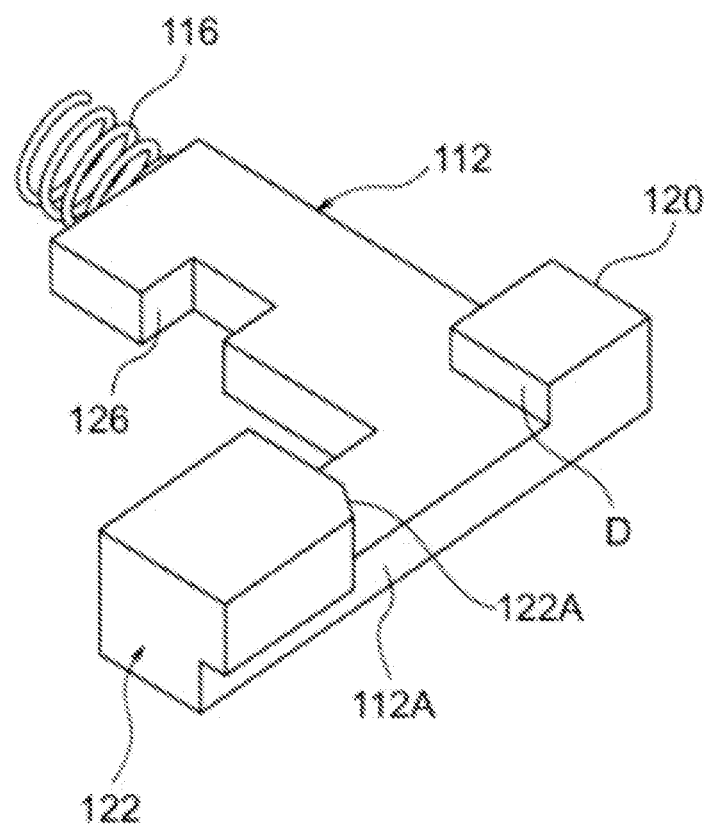
FIG. 11 is an enlarged perspective view of the lock member illustrated in FIG. 10.

As illustrated in FIG. 11, the pushed part 122 of the lock member 112 has a sloping surface 122A configured to face the sloping surface 124A of the unlocking projection 124 when the lock member 112 is at the locking position. When the sloping surface 122A is pushed toward the second side in the device width direction by the sloping surface 124A of the unlocking projection 124, the lock member 112 is moved from the locking position to the unlocking position.

As illustrated in FIG. 10, the stop member 130 that stops the lock member 112 from restraining the sliding (movement) of the fastening slider 50 is provided on the second side of the lock member 112 in the device width direction. The stop member 130 is movable in the same direction as the fastening slider 50 and moves between a retaining position that is nearer to the lock member 112 and a releasing position that is farther from the lock member 112. The retaining position and the releasing position will be described separately below, together with the behavior of the stop member 130.

The stop member 130 is positioned between the lock member 112 and a supporting wall 132 included in the lower case 36. A retaining spring 134 as an exemplary stop elastic member is provided between an end of the stop member 130 and the supporting wall 132. The retaining spring 134 urges the stop member 130 toward the lock member 112. In addition, a pair of guide walls 136 that guide the movement of the stop member 130 are provided on two respective sides of the stop member 130.

The stop member 130 includes an anchoring portion 130A at the other end thereof. When the stop member 130 is at the retaining position, the anchoring portion 130A is fitted in a recess 126 provided in the lock member 112. With the anchoring of the lock member 112 by the anchoring portion 130A, the lock member 112 is retained at the unlocking position against the urging force exerted by the locking spring 116.

The stop member 130 further includes a pushed portion 130B at which the stop member 130 is pushed from the retaining position to the releasing position by a lock enabling part 138A included in the fastening slider 50. Specifically, the extended portion 50B of the fastening slider 50 includes an arm portion 138 extending toward the lock member 112. The arm portion 138 is provided across the lock member 112 from the stop member 130. The tip of the arm portion 138 is bent toward the stop member 130, crossing the lock member 112 from the first side toward the second side in the device width direction.

Figure 12:
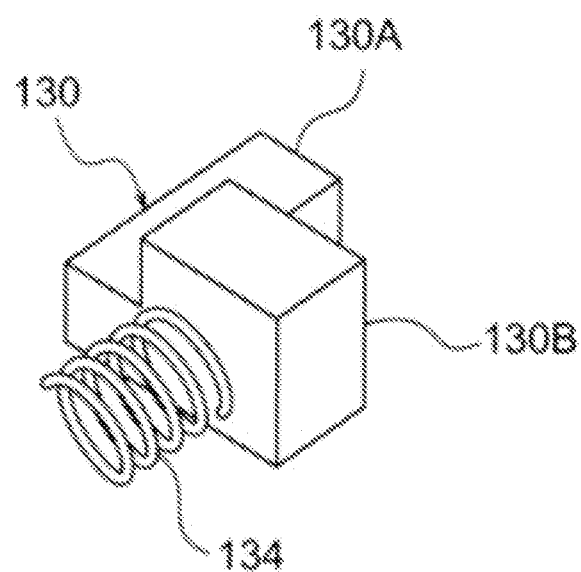
FIG. 12 is an enlarged perspective view of the stop member illustrated in FIG. 10.

The tip of the arm portion 138 forms the lock enabling part 138A configured to come into contact with the pushed portion 130B of the stop member 130. When the fastening slider 50 is slid from the fastening position to the attachable and detachable position, the lock enabling part 138A pushes the pushed portion 130B such that the stop member 130 is moved from the retaining position to the releasing position. Thus, the anchoring portion 130A of the stop member 130 is retracted from the recess 126 of the lock member 112, and the lock member 112 that has been retained by the stop member 130 is released. Consequently, the lock member 112 is moved to the locking position with the urging force exerted by the locking spring 116. As illustrated in FIG. 12, the pushed portion 130B has a larger height than the anchoring portion 130A so as to come into contact with the lock enabling part 138A.

Now, behaviors of the lock member 112 and the stop member 130 taken when the notebook PC 12 is attached to the attachment device 30 will be described. In FIGS. 13A to 13C and FIGS. 14A to 14D to be referred to below, the pairs of guide walls 118 and 136 are not illustrated.

Referring to FIGS. 5A and 5B, to attach the notebook PC 12 to the attachment device 30, the hook anchoring portions 64 of the body-side casing 20 are pressed against the catches 60A of the hook portions 60 of the fastening slider 50 as described above. Then, the fastening slider 50 is slid from the fastening position illustrated by the dash-dot-dot line to the attachable and detachable position illustrated by the solid line.

Figure 13A:
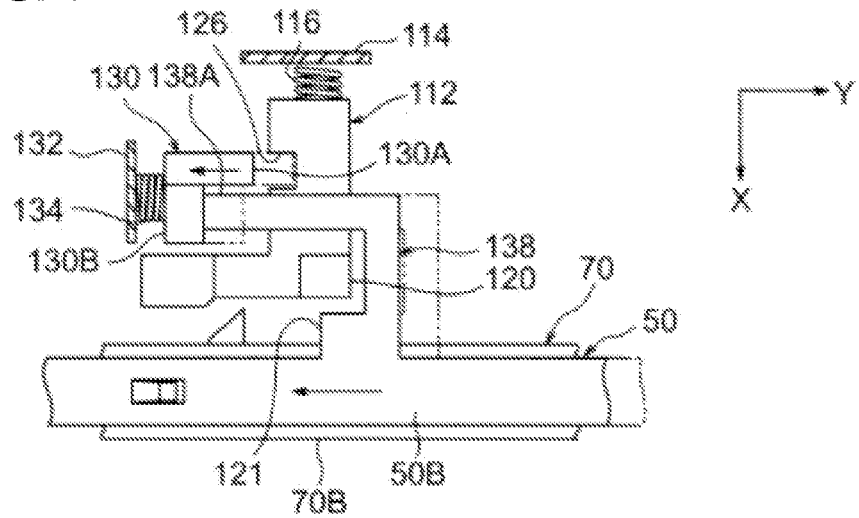
FIG. 13A is a plan view illustrating behaviors of the lock member and the stop member illustrated in FIG. 10.
Figure 13B:
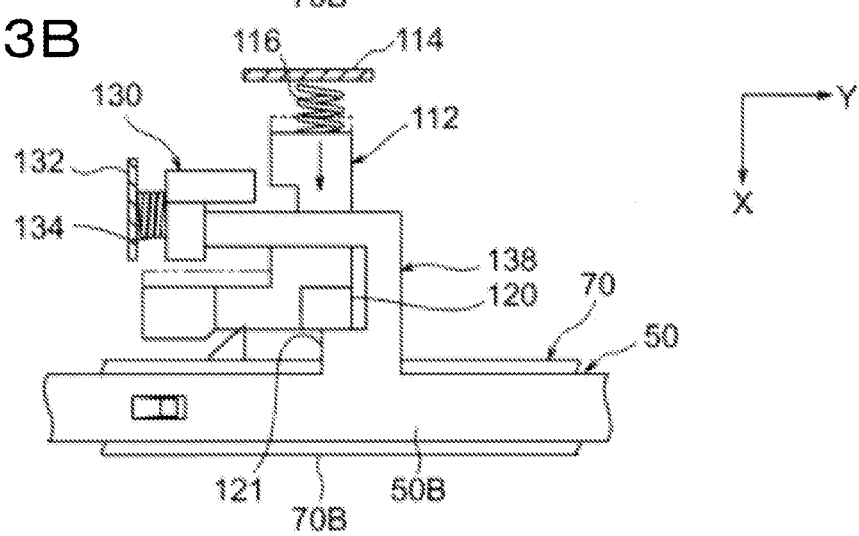
FIG. 13B is another plan view illustrating behaviors of the lock member and the stop member illustrated in FIG. 10.

With the sliding of the fastening slider 50 from the fastening position to the attachable and detachable position, referring now to FIG. 13A, the lock enabling part 138A of the fastening slider 50 pushes the pushed portion 130B of the stop member 130. Then, the stop member 130 is moved from the retaining position illustrated by the dash-dot-dot line to the releasing position illustrated by the solid line, whereby the anchoring portion 130A of the stop member 130 is retracted from the recess 126 of the lock member 112. Consequently, the lock member 112 that has been retained by the stop member 130 is released, and the lock member 112 moves toward the fastening slider 50 as illustrated in FIG. 13B with the urging force exerted by the locking spring 116 and comes into contact with the engaging part 121 of the fastening slider 50.

Subsequently, referring to FIG. 5B, the hook portions 60 of the fastening slider 50 are moved from the respective attachable and detachable positions illustrated by the solid line to the respective fastening positions illustrated by the dash-dot-dot line with the urging force exerted by the elastic member (not illustrated), whereby the catches 60A of the hook portions 60 are anchored to the respective hook anchoring portions 64. Thus, the body-side casing 20 of the notebook PC 12 is fastened to the mounting portion 34A of the casing 32 of the attachment device 30.

Figure 13C:
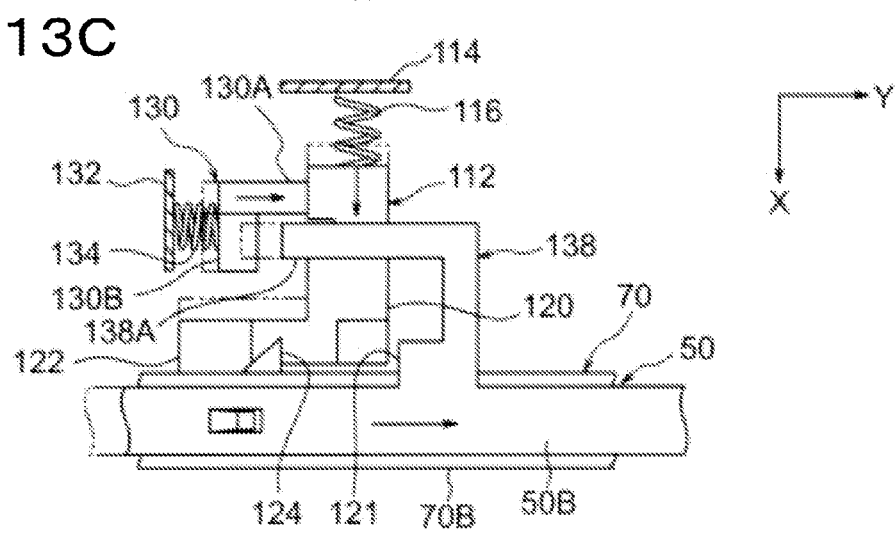
FIG. 13C is yet another plan view illustrating behaviors of the lock member and the stop member illustrated in FIG. 10.

With the sliding of the fastening slider 50 from the attachable and detachable position to the fastening position, referring now to FIG. 13C, the engaging part 121 of the fastening slider 50 is moved, and the lock member 112 moves to the locking position illustrated by the solid line. Consequently, even if it is attempted to move the fastening slider 50 from the fastening position to the attachable and detachable position by using the operation lever 80 (see FIG. 8A), the engaging part 121 engages with the stopper part 120 of the lock member 112. Thus, the fastening slider 50 is restrained from sliding.

Now, behaviors of the lock member 112 and the stop member 130 taken when the notebook PC 12 is detached from the attachment device 30 will be described.

To detach the notebook PC 12 from the attachment device 30, the operation lever 80 is rotated as illustrated in FIG. 7, and the unlocking projection 124, the hook portions 60, and the sloping parts 76 are sequentially made to operate. Specifically, the operation lever 80 is first rotated as illustrated in FIGS. 8A and 8B, whereby the detaching slider 70 is slid toward the second side in the device width direction. With the sliding of the detaching slider 70, referring now to FIG. 14A, the sloping surface 124A of the unlocking projection 124 pushes the sloping surface 122A of the pushed part 122 of the lock member 112. Thus, the lock member 112 is moved from the locking position illustrated by the dash-dot-dot line to the unlocking position illustrated by the solid line, whereby the fastening slider 50 that has been restrained from sliding by the lock member 112 is released.

When the operation lever 80 is further rotated, referring now to FIG. 6A, the hook portions 60 of the fastening slider 50 move from the respective fastening positions to the respective attachable and detachable positions, whereby the body-side casing 20 of the notebook PC 12 that has been fastened by the catches 60A of the hook portions 60 is released. Furthermore, as illustrated in FIG. 6B, the detaching slider 70 slides toward the second side in the device width direction, whereby the bottom wall 20L of the body-side casing 20 is pushed upward by the pushing projections 78C of the pushing members 78. Thus, the body-side casing 20 of the notebook PC 12 is detached from the mounting portion 34A of the attachment device 30, that is, the notebook PC 12 is removed from the attachment device 30.

Figure 14A:
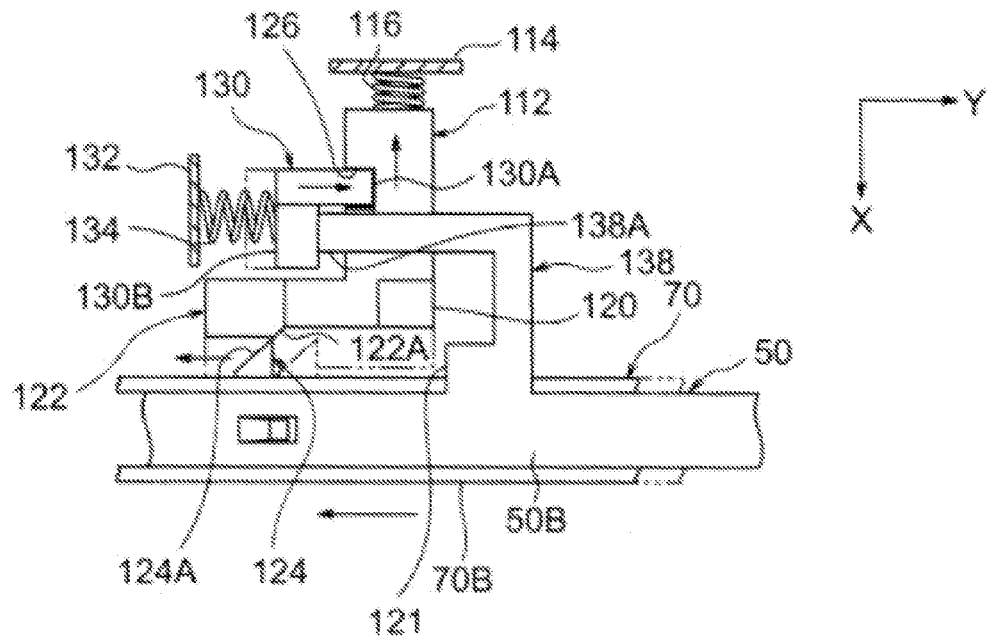
FIG. 14A is yet another plan view illustrating behaviors of the lock member and the stop member illustrated in FIG. 10.
Figure 14B:
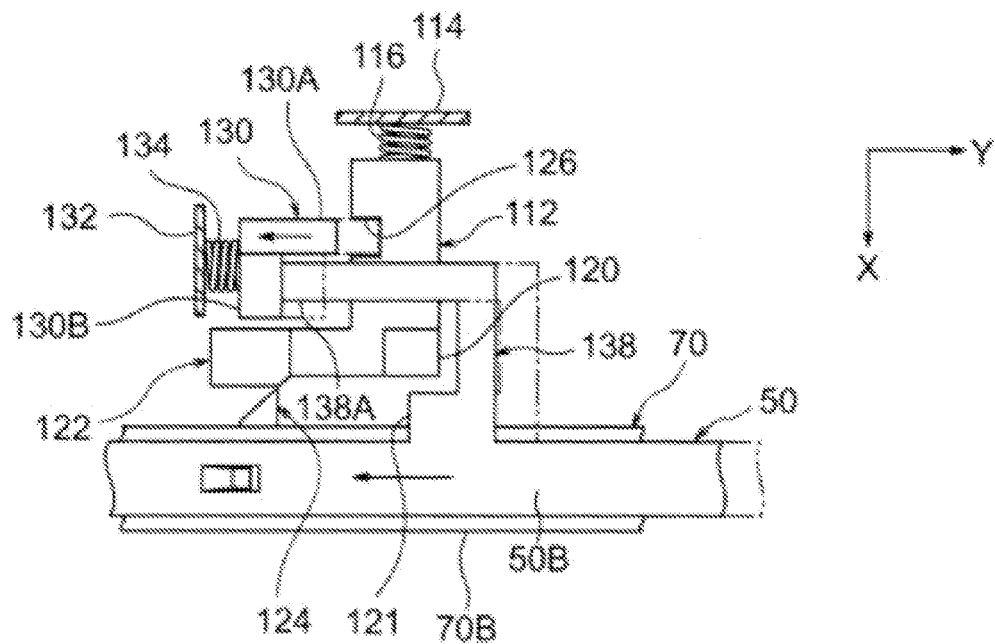
FIG. 14B is yet another plan view illustrating behaviors of the lock member and the stop member illustrated in FIG. 10.

In this step, referring to FIG. 14B, the lock enabling part 138A of the fastening slider 50 pushes the pushed portion 130B of the stop member 130, whereby the stop member 130 is moved from the retaining position illustrated by the dash-dot-dot line to the releasing position illustrated by the solid line.

Figure 14C:
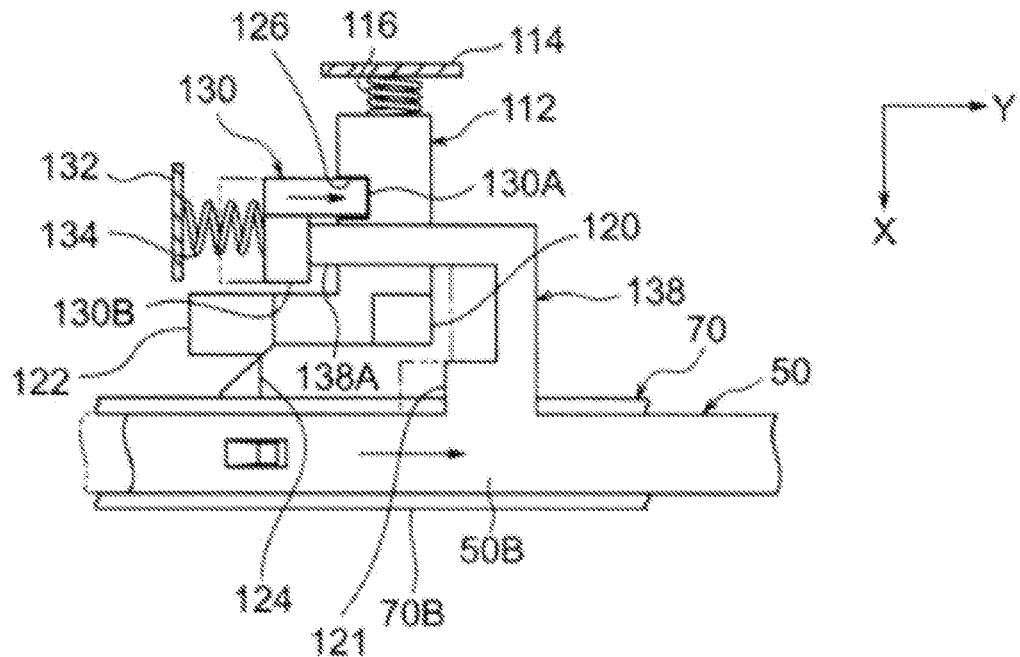
FIG. 14C is yet another plan view illustrating behaviors of the lock member and the stop member illustrated in FIG. 10.

Subsequently, when the operation lever 80 is rotated in the reverse direction, referring now to FIG. 14C, the fastening slider 50 slides from the attachable and detachable position to the fastening position. With the sliding of the fastening slider 50, the arm portion 138 of the fastening slider 50 moves toward the first side in the device width direction, and the stop member 130 moves from the releasing position illustrated by the dash-dot-dot line to the retaining position illustrated by the solid line. Thus, the anchoring portion 130A of the stop member 130 is inserted into the recess 126 of the lock member 112, whereby the lock member 112 is retained at the unlocking position. That is, the stop member 130 stops the lock member 112 from restraining the sliding of the fastening slider 50. The stop member 130 retains the lock member 112 at the unlocking position until the notebook PC 12 is reattached to the attachment device 30, that is, until the notebook PC 12 is fastened to the casing 32 of the attachment device 30 by the hook portions 60 of the fastening slider 50.

Figure 14D:
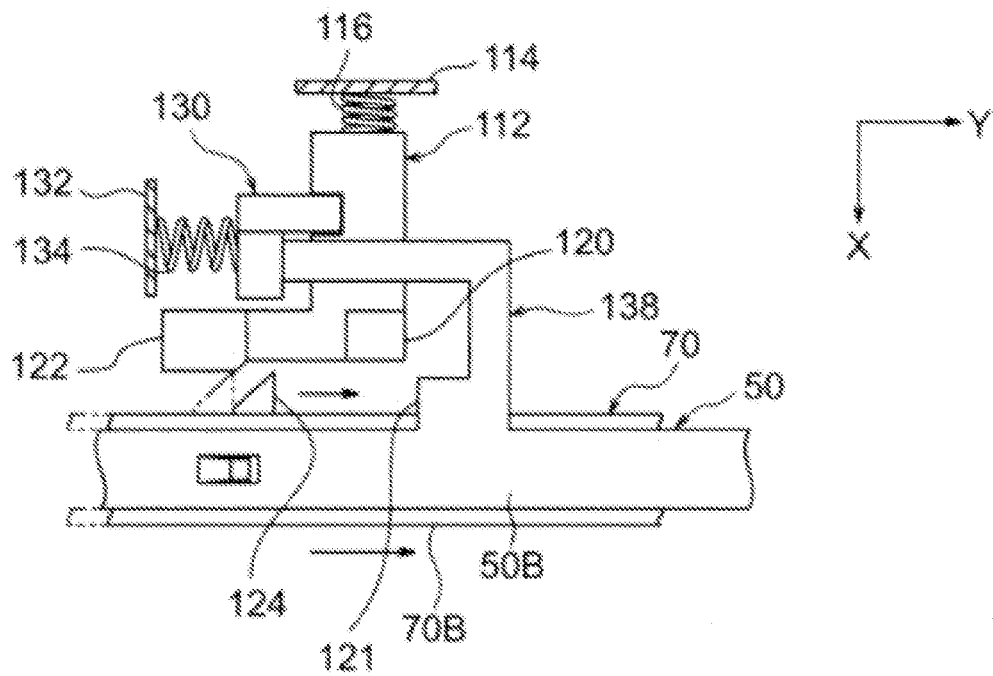
FIG. 14D is yet another plan view illustrating behaviors of the lock member and the stop member illustrated in FIG. 10.

When the operation lever 80 is further rotated in the reverse direction such that the operation lever 80 returns to the initial position, referring now to FIG. 14D, the detaching slider 70 slides toward the first side in the device width direction. Thus, the unlocking projection 124 is positioned between the pushed part 122 and the stopper part 120 of the lock member 112.

Now, functions and advantageous effects of the present embodiment will be described.

As described above, when the notebook PC 12 is attached to the attachment device 30, the body-side casing 20 of the notebook PC 12 is fastened to the casing 32 of the attachment device 30 by the hook portions 60 of the fastening slider 50. In this state, when the security lock 82 is attached to the lock attaching portion 84 of the attachment device 30, the restraining member 90 restrains the detaching slider 70 from sliding, whereby the operation lever 80 is disabled. Hence, the detaching of the notebook PC 12 from the attachment device 30 by using the operation lever 80 is disabled, making it difficult to steal the attachment device 30 and the notebook PC 12.

Furthermore, in the state where the body-side casing 20 of the notebook PC 12 is fastened to the casing 32 of the attachment device 30 by the hook portions 60 of the fastening slider 50, the lock member 112 restrains the fastening slider 50 from sliding from the fastening position to the attachable and detachable position. Hence, for example, even if the fastening slider 50 is directly operated by any tool or the like from the outside of the casing 32 of the attachment device 30, the fastening slider 50 is difficult to move from the fastening position to the attachable and detachable position, making it more difficult to steal the notebook PC 12.

To detach the notebook PC 12 from the attachment device 30, the security lock 82 is temporarily removed from the attachment device 30, and the operation lever 80 is operated such that the body-side casing 20 of the notebook PC 12 is detached from the casing 32 of the attachment device 30. Subsequently, as an antitheft measure for the attachment device 30, the security lock 82 is reattached to the attachment device 30.

If the operation lever 80 is operated in the above state, the detaching slider 70 moves the lock member 112 from the locking position to the unlocking position and then the stop member 130 retains the lock member 112 at the unlocking position as described above. That is, the stop member 130 stops the lock member 112 from restraining the sliding of the fastening slider 50. Hence, in the state where the notebook PC 12 has been detached from the attachment device 30, the fastening slider 50 is allowed to slide from the fastening position to the attachable and detachable position. That is, in the state where the body-side casing 20 of the notebook PC 12 is not fastened to the casing 32 of the attachment device 30 by the hook portions 60 of the fastening slider 50, the fastening slider 50 is allowed to slide from the fastening position to the attachable and detachable position.

Therefore, even if the security lock 82 is attached to the attachment device 30, the notebook PC 12 is allowed to be attached to the attachment device 30 by sliding the fastening slider 50 from the fastening position to the attachable and detachable position. That is, in the present embodiment, the security lock 82 does not have to be removed from the attachment device 30 before the notebook PC 12 is attached to the attachment device 30. Thus, the number of steps of attaching the notebook PC 12 to the attachment device 30 is reduced.

According to the present embodiment, while antitheft measures are taken in the attachment device 30 and the notebook PC 12, the number of steps of attaching the notebook PC 12 to the attachment device 30 is reduced.

According to the present embodiment, the arm portion 138 of the fastening slider 50 includes the lock enabling part 138A. Such a configuration makes the configuration of the attachment device 30 simpler than in a case where any lock enabling part is provided separately from the fastening slider 50.

Furthermore, the unlocking projection 124 is included in the detaching slider 70. Such a configuration makes the configuration of the attachment device 30 simpler than in a case where any unlocking projection is provided separately from the detaching slider 70.

Now, modifications of the above embodiment will be described.

While the above embodiment concerns a case where the fastening slider 50 includes the lock enabling part 138A, the embodiment is not limited to such a case. For example, a lock enabling part that pushes the pushed portion 130B of the stop member 130 when the fastening slider 50 is slid may be provided separately from the fastening slider 50.

While the above embodiment concerns a case where the detaching slider 70 serves as an unlock member, the embodiment is not limited to such a case. For example, an unlock member configured to be slid by the operation lever 80 may be provided separately from the detaching slider 70, and the unlock member may include the unlocking projection 124.

While the above embodiment concerns a case where the fastening slider 50 and the detaching slider 70 are slid by using the operation lever 80, the embodiment is not limited to such a case. The operation lever only has to be capable of moving the fastening slider 50 and the detaching slider 70, and the shape and the mechanism of the operation lever may be changed appropriately.

While the above embodiment concerns a case where the notebook PC 12 is to be attached to the attachment device 30, the embodiment is not limited to such a case. The electronic device to be attached to the attachment device 30 may alternatively be a tablet terminal or the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:
1. An attachment device comprising:
  a casing;

a fastener member provided in the casing and movable between an attachable and detachable position where an electronic device is attachable to or detachable from the casing and a fastening position where the electronic device is fastened to the casing;

a lock member provided in the casing and configured to restrain the fastener member from moving from the fastening position to the attachable and detachable position; and a stop member provided in the casing and configured to stop the lock member from restraining the movement of the fastener member, the stop member stopping the lock member until the fastener member fastens the electronic device to the casing.

2. The attachment device according to claim 1, wherein the lock member is movable between a locking position where the lock member restrains the fastener member and an unlocking position where the lock member releases the fastener member, and wherein the stop member retains the lock member at the unlocking position until the fastener member fastens the electronic device to the casing, and the stop member releases the lock member and allows the lock member to move to the locking position after the fastener member fastens the electronic device to the casing.

3. The attachment device according to claim 2, further comprising an operation member that moves the lock member from the locking position to the unlocking position and allows the stop member to retain the lock member.

4. The attachment device according to claim 3, wherein the operation member allows the fastener member to move from the fastening position to the attachable and detachable position after the lock member is moved to the unlocking position by an unlock member.

5. The attachment device according to claim 2, further comprising a lock enabling part that disables the stop member from retaining the lock member and allows the lock member to move to the locking position when the fastener member is moved from the fastening position to the attachable and detachable position.

6. The attachment device according to claim 5, wherein the stop member is movable between a retaining position where the stop member retains the lock member at the unlocking position and a releasing position where the stop member releases the lock member, and wherein the lock enabling part is included in the fastener member and is configured to move the stop member from the retaining position to the releasing position when the fastener member is moved from the fastening position to the attachable and detachable position.

7. The attachment device according to claim 3, further comprising:

an unlock member configured to push the lock member from the locking position to the unlocking position by moving in a direction intersecting a direction of movement of the lock member, wherein the operation member allows the lock member to move from the locking position to the unlocking position by moving the unlock member.

8. The attachment device according to claim 2, further comprising a lock elastic member that urges the lock member in a direction from the unlocking position toward the locking position.

9. The attachment device according to claim 8, wherein the stop member includes an anchoring portion that anchors the lock member in a direction of urging by the lock elastic member when the stop member is at the retaining position.

10. The attachment device according to claim 6, further comprising a stop elastic member that urges the stop member in a direction from the releasing position toward the retaining position.

11. An electronic apparatus comprising:

an attachment device including a casing, a fastener member provided in the casing and movable between an attachable and detachable position where an electronic device is attachable to or detachable from the casing and a fastening position where the electronic device is fastened to the casing, a lock member provided in the casing and configured to restrain the fastener member from moving from the fastening position to the attachable and detachable position, and a stop member provided in the casing and configured to stop the lock member from restraining the movement of the fastener member, the stop member stopping the lock member until the fastener member fastens the electronic device to the casing; and the electronic device attached to the casing, including a fastened portion configured to be fastened by the fastener member.

12. A locking mechanism comprising:

a lock member configured to restrain a fastener member from moving from a fastening position where an electronic device is fastened to a casing of an attachment device to an attachable and detachable position where the electronic device is attachable to or detachable from the casing; and a stop member configured to stop the lock member from restraining the movement of the fastener member, the stop member stopping the lock member until the fastener member fastens the electronic device to the casing.

* * * * *